United States Patent
Hishikawa et al.

(10) Patent No.: US 7,759,987 B2
(45) Date of Patent: Jul. 20, 2010

(54) MULTI-CHANNEL SEMICONDUCTOR INTEGRATED CIRCUIT

(75) Inventors: Naoki Hishikawa, Osaka (JP); Hiroki Matsunaga, Osaka (JP); Jinsaku Kaneda, Osaka (JP)

(73) Assignee: Panasonic Corporation, Osaka (JP)

( * ) Notice: Subject to any disclaimer, the term of this patent is extended or adjusted under 35 U.S.C. 154(b) by 12 days.

(21) Appl. No.: 12/048,895

(22) Filed: Mar. 14, 2008

(65) Prior Publication Data

US 2008/0246529 A1  Oct. 9, 2008

(30) Foreign Application Priority Data

Apr. 5, 2007  (JP) ................ 2007-099203

(51) Int. Cl.
*H03B 1/00* (2006.01)
(52) U.S. Cl. ...................... 327/112; 327/333
(58) Field of Classification Search ......... 327/108–112, 327/170, 333, 389, 391; 326/68, 80–83, 326/22–27; 365/189.11, 230.06
See application file for complete search history.

(56) References Cited

U.S. PATENT DOCUMENTS 5,113,087 A * 5/1992 Ueno ................ 327/333
6,452,365 B1 * 9/2002 Majumdar et al. ......... 323/223
7,038,274 B2 * 5/2006 You et al. .................. 257/335
7,358,968 B2 * 4/2008 Sasada et al. .............. 345/204

FOREIGN PATENT DOCUMENTS

JP  2006-094301  4/2006

OTHER PUBLICATIONS

U.S. Appl. No. 12/048,787, filed on Mar. 14, 2008.

* cited by examiner

*Primary Examiner*—Long Nguyen
*Assistant Examiner*—Sibin Chen
(74) *Attorney, Agent, or Firm*—McDermott Will & Emery LLP (57) ABSTRACT

A semiconductor integrated circuit includes a high-side transistor, a low-side transistor, a level shift circuit for driving the high-side transistor, and a pre-driver circuit for driving the low-side transistor. A connection point of the high-side transistor and the low-side transistor serves as an output terminal. The level shift circuit has first and second N-type MOS transistors whose gates are driven by the pre-driver circuit. The semiconductor integrated circuit further includes a diode whose anode is connected to the drain of the first or second N-type MOS transistor to which the gate of the high-side transistor is not connected, and whose cathode is connected to the output terminal.

18 Claims, 7 Drawing Sheets

MULTI-CHANNEL SEMICONDUCTOR INTEGRATED CIRCUIT

BACKGROUND OF THE INVENTION

1. Field of the Invention

The present invention relates to a semiconductor integrated circuit and, more particularly, to a multi-channel semiconductor integrated circuit for driving a capacitive load, such as particularly a plasma display or the like.

2. Description of the Related Art

As a conventional high-withstand voltage driver circuit, there is a known half-bridge circuit including a P-channel MOS transistor and an N-channel MOS transistor (see, for example, FIG. 5 in Japanese Unexamined Patent Application Publication No. 2006-94301).

Figure 6:
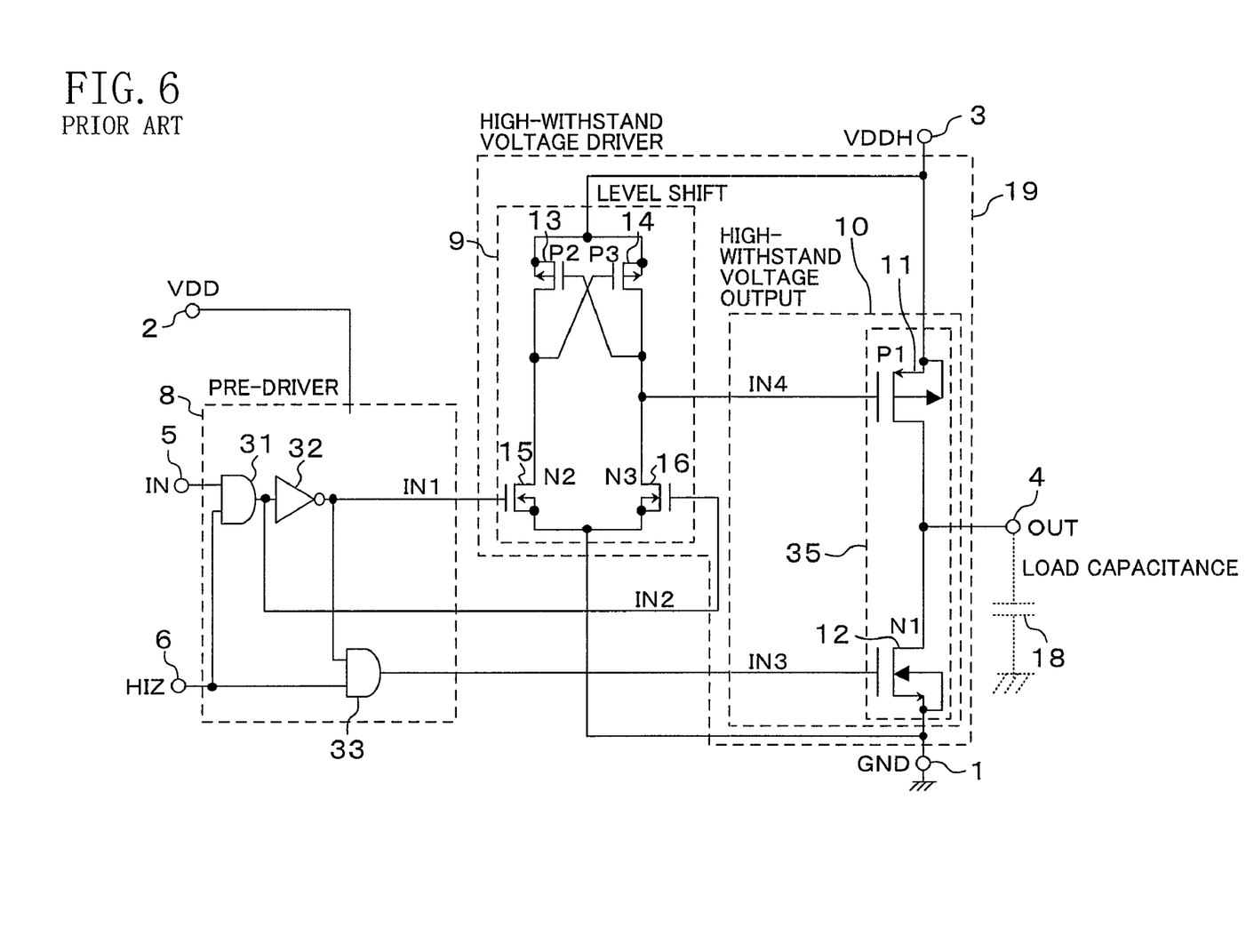
FIG. 6 is a diagram showing a high-withstand voltage output circuit in a conventional multi-channel semiconductor integrated circuit.

FIG. 6 is a diagram showing a circuit configuration of a conventional drive circuit which is often used as a scanning driver circuit for plasma display panel (PDP) apparatuses.

In FIG. 6, a high-withstand voltage driver 19 comprises a high-withstand voltage output 10 including a high-side transistor 11 and a low-side transistor 12, and a level shift circuit 9 for driving the high-side transistor 11. Note that 8 indicates a pre-driver for driving the level shift circuit 9 and the low-side transistor 12, 4 indicates a high-withstand voltage output terminal, 3 indicates a high-voltage power supply terminal for 100 V or more (VDDH), and 2 indicates a low-voltage power supply terminal for about 5 V (VDD).

Hereinafter, an operation of the high-withstand voltage driver 19 of FIG. 6 will be described with reference to FIG. 7.

Figure 7:
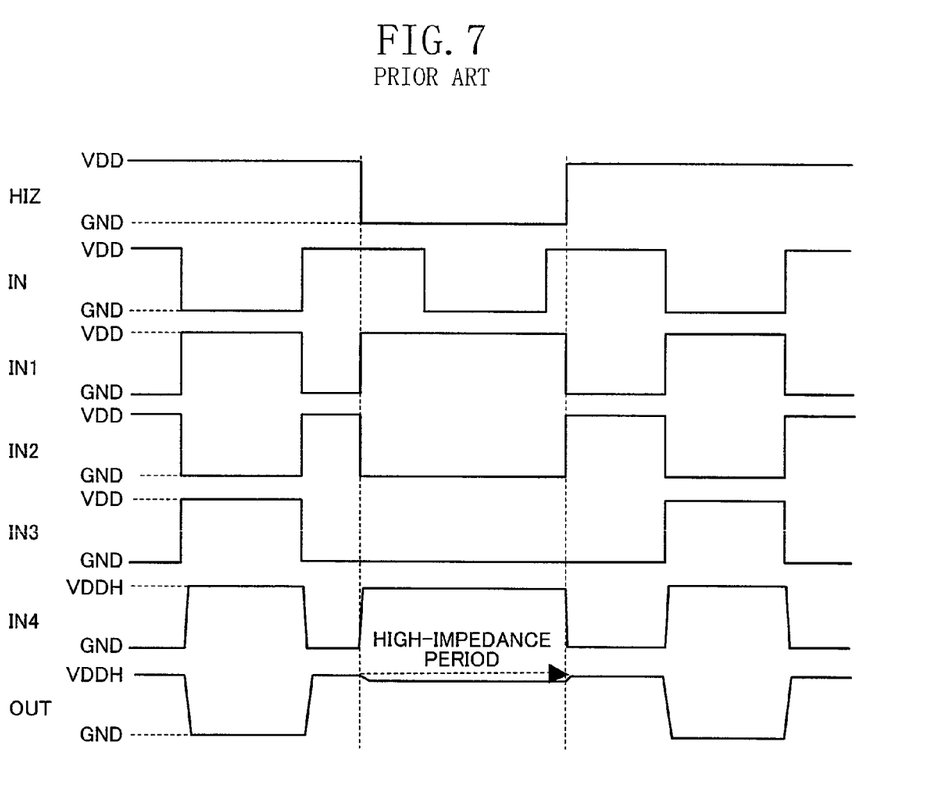
FIG. 7 is a timing diagram for describing an operation of the high-withstand voltage output circuit in the conventional multi-channel semiconductor integrated circuit.

FIG. 7 is a timing diagram for describing the operation of the conventional high-withstand voltage driver 19.

FIG. 7 shows input signals IN and HIZ which are input from a low-withstand voltage control section to control signal input terminals 5 and 6, output signals IN1 and IN2 of the pre-driver 8 which are used to drive the level shift circuit 9 in accordance with the input signals IN and HIZ, an output signal IN3 of the pre-driver 8 which is used to drive the low-side transistor 12 in accordance with the input signals IN and HIZ, an output signal IN4 of the level shift circuit 9 which is used to drive the high-side transistor 11 in accordance with the output signals IN1 and IN2 of the pre-driver 8, and a voltage waveform OUT of the high-withstand voltage output terminal 4 which is output in accordance with the output signal IN3 of the pre-driver 8.

Firstly, a case where the input signal HIZ of the control signal input terminal 6 is at the H level (VDD) will be described.

In this case, an AND circuit 31 is in a state in which its output will be determined, depending on the input signal IN of the control signal input terminal 5. In this state, when a signal having the GND level is input to the control signal input terminal 5, i.e., the input signal IN goes to the L level (GND), the output of the AND circuit 31 goes to the L level, the output signal IN1 of an inverter 32 goes to the H level (VDD), and the output signal IN2 goes to the L level (GND). As a result, in the level shift circuit 9, an N-channel MOS transistor 15 is switched ON, a P-channel MOS transistor 14 is switched ON, an N-channel MOS transistor 16 is switched OFF, and a P-channel MOS transistor 13 is switched OFF, so that the output signal IN4 goes to the H level (VDDH). As a result, the high-side transistor 11 is switched OFF, and the output signal IN3 of an AND circuit 33 goes to the H level (VDD), so that the low-side transistor 12 is switched ON, and therefore, the high-withstand voltage output terminal 4 goes to the L level (GND).

Conversely, it is assumed that a signal having the VDD level is input to the control signal input terminal 5, i.e., the input signal IN goes to the H level (VDD). In this case, in the level shift circuit 9, the N-channel MOS transistor 15 is switched OFF, the P-channel MOS transistor 14 is switched OFF, the N-channel MOS transistor 16 is switched ON, and the P-channel MOS transistor 13 is switched ON, so that the output signal IN4 goes to the L level (GND), the high-side transistor 13 is switched ON, and the output signal IN3 goes to the L level (GND). As a result, the low-side transistor 14 is switched OFF, so that the high-withstand voltage output terminal 4 goes to the H level (VDDH).

Next, a case where the input signal HIZ of the control signal input terminal 6 is at the L level (GND) will be described.

In this case, the outputs of the AND circuits 31 and 33 go to the L level (GND) and the output of the inverter 32 goes to the H level. As a result, the high-side transistor 11 is switched OFF and the low-side transistor 12 is also switched OFF, so that the high-withstand voltage output terminal goes to the high-impedance state.

The conventional high-withstand voltage driver in multi-channel semiconductor integrated circuits has a problem that, when the high-withstand voltage output terminal is short-circuited due to any external factor, the device may be broken, depending on the current overload capacity and short-circuit time of the device.

There is also a problem that, when a short-circuit protection circuit which is used in a typical low-withstand voltage circuit is applied to a high-withstand voltage multi-channel driver circuit, the chip area increases.

SUMMARY OF THE INVENTION

In view of the above-described problems, the present invention has been achieved. An object of the present invention is to provide an output circuit which achieves short-circuit protection so as to prevent a high-withstand voltage output terminal from being broken.

To achieve the object, according to a first embodiment of the present invention, a semiconductor integrated circuit is provided which includes a high-side transistor connected to a first reference potential, a low-side transistor connected to a second reference potential, a level shift circuit for driving the high-side transistor, and a pre-driver circuit for driving the low-side transistor. A connection point of the high-side transistor and the low-side transistor serves as an output terminal. The level shift circuit has first and second N-type MOS transistors whose gates are driven by the pre-driver circuit. The semiconductor integrated circuit further includes a diode whose anode is connected to the drain of the first or second N-type MOS transistor to which the gate of the high-side transistor is not connected, and whose cathode is connected to the output terminal.

In the semiconductor integrated circuit of the first embodiment of the present invention, both the first and second N-type MOS transistors are switched OFF in accordance with a control signal from the pre-driver circuit. The output terminal temporarily holds a state as it is immediately before the control signal is input.

According to a second embodiment of the present invention, a semiconductor integrated circuit is provided which includes a high-side transistor connected to a first reference potential, a low-side transistor connected to a second reference potential, a level shift circuit for driving the high-side transistor, and a pre-driver circuit for driving the low-side transistor. A connection point of the high-side transistor and the low-side transistor serves as an output terminal. The level shift circuit has first and second IGBTs whose gates are driven by the pre-driver circuit. The semiconductor integrated circuit further includes a diode whose anode is connected to the collector of the first or second IGBT to which the gate of the high-side transistor is not connected, and whose cathode is connected to the output terminal.

In the semiconductor integrated circuit of the second embodiment of the present invention, both the first and second IGBTs are switched OFF in accordance with a control signal from the pre-driver circuit. The output terminal temporarily holds a state as it is immediately before the control signal is input.

The semiconductor integrated circuit of the first or second embodiment of the present invention further includes an output protection control circuit for generating the control signal using a plurality of binary input control signals and a sequential circuit.

The semiconductor integrated circuit of the first or second embodiment of the present invention further includes an output protection control circuit for generating the control signal using a built-in asynchronous oscillator.

In the semiconductor integrated circuit of the first or second embodiment of the present invention, the output protection control circuit generates the control signal which switches OFF gate signals of both the first and second transistors after the binary control signals are input if the high-side transistor is ON and the low-side transistor is OFF before the binary control signals are input. The output protection control circuit generates the control signal which switches OFF both the first and second transistors after the binary control signals are input if the high-side transistor is OFF and the low-side transistor is ON before the binary control signals are input.

In the semiconductor integrated circuit of the first or second embodiment of the present invention, the output circuit has a plurality of bits.

In the semiconductor integrated circuit of the first or second embodiment of the present invention, the output protection control circuit is a single common circuit.

In the semiconductor integrated circuit of the first or second embodiment of the present invention, the high-side transistor is a thick-film P-type MOS transistor.

In the semiconductor integrated circuit of the first or second embodiment of the present invention, the output circuit is a display drive circuit for a flat panel display.

Thus, according to the multi-channel semiconductor integrated circuit of the present invention, it is possible to prevent the device from being broken due to an overcurrent occurring during a short-circuit, and it is also possible to suppress an increase in chip area.

DETAILED DESCRIPTION OF THE PREFERRED EMBODIMENTS

Hereinafter, embodiments of the present invention will be described with reference to the accompanying drawings.

First Embodiment

Figure 1:
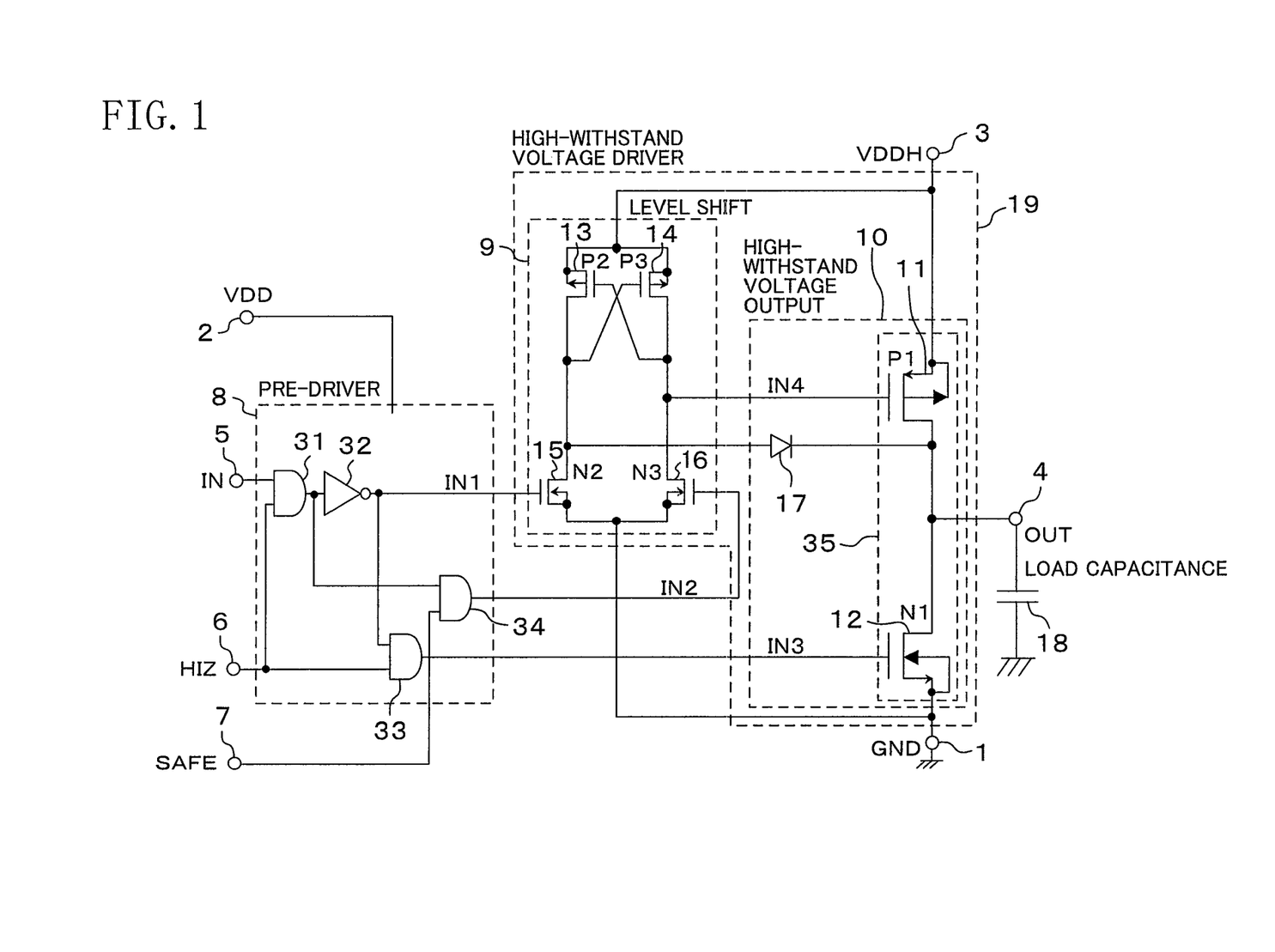
FIG. 1 is a diagram showing an exemplary configuration of a high-withstand voltage driver in a multi-channel semiconductor integrated circuit according to a first embodiment of the present invention.

FIG. 1 is a diagram showing a configuration of a multi-channel semiconductor integrated circuit according to a first embodiment of the present invention.

As shown in FIG. 1, a high-withstand voltage driver 19 comprises a high-withstand voltage output 10 and a level shift circuit 9. The high-withstand voltage output 10 has a half-bridge 35 including a high-side transistor 11 and a low-side transistor 12. The level shift circuit 9 includes thick-film gate P-type MOS transistors 13 and 14 and thin-film gate N-type MOS transistors 15 and 16. The high-withstand voltage driver 19 is driven by a pre-driver 8 in accordance with a signal which is input through a control input terminal 5 from a low-withstand voltage control section, to charge and discharge a load capacity 18. The high-side transistor 11 and the low-side transistor 12 are forced to be switched OFF, via the pre-driver 8 and the level shift circuit 9, in accordance with a signal which is input through a control input terminal 6 irrespective of the state of the control input terminal 5, so that the output terminal goes to the high impedance state.

A high-voltage power supply terminal 3 is connected to the high-side transistor 11. A reference potential terminal 1 is connected to the low-side transistor 12. A low-voltage power supply terminal 2 is connected to the pre-driver 8. A high-withstand voltage output terminal 4 is connected to the half-bridge 35. Note that the high-side transistor 11 is used to output a high level, and the low-side transistor 12 is used to output a low level.

The anode of a high-withstand voltage diode 17 is connected to the drain of the thin-film gate N-type MOS transistor 15 in the level shift circuit 9, and the cathode of the high-withstand voltage diode 17 is connected to the high-withstand voltage output terminal 4.

Figure 2:
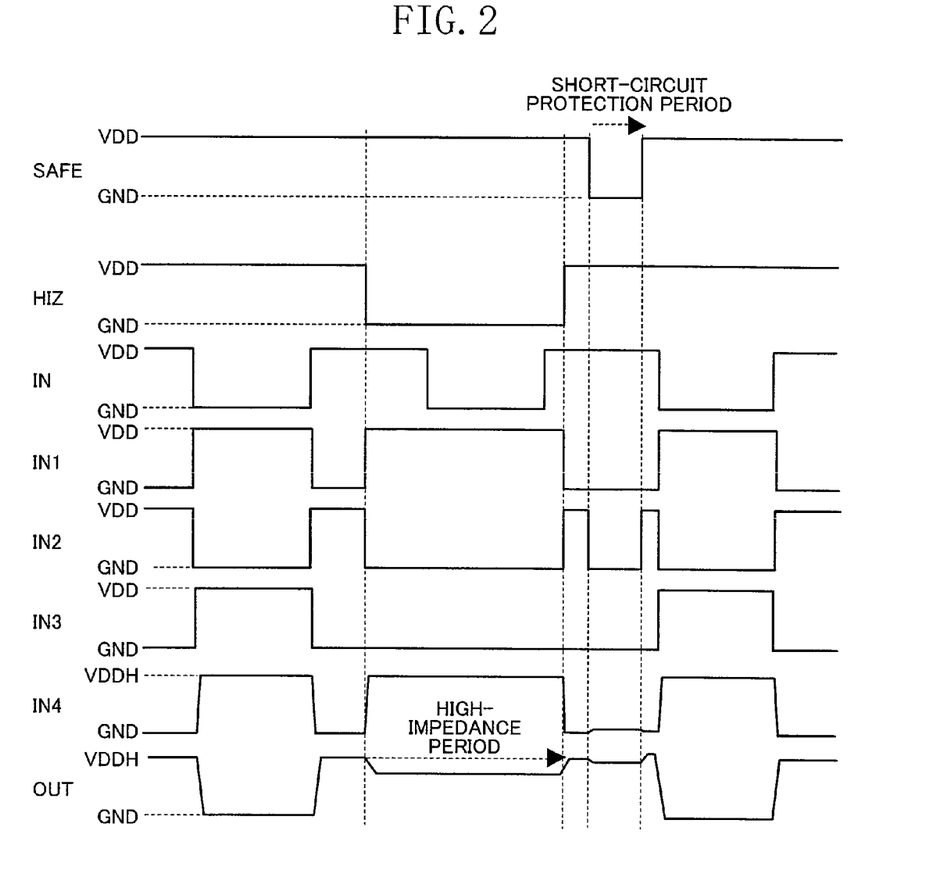
FIG. 2 is a timing diagram for describing an operation of the high-withstand voltage driver in the multi-channel semiconductor integrated circuit of the first embodiment of the present invention.

FIG. 2 is a timing diagram for describing an operation of the multi-channel semiconductor integrated circuit of the first embodiment of the present invention.

FIG. 2 shows an input signal IN which is input from a low-withstand voltage control section to the input terminal 5, an input signal HIZ which is input from the low-withstand voltage control section to the input terminal 6, an input signal SAFE which is input from the low-withstand voltage control section to an input terminal 7, output signals IN1 and IN2 of the pre-driver 8 which are used to drive the level shift circuit 9 in accordance with the input signal IN, the input signal HIZ, and the input signal SAFE, an output signal IN3 of the pre-driver 8 which is used to drive the low-side transistor 12 in accordance with the input signals IN and HIZ, an output signal IN4 of the level shift circuit 9 which is used to drive the high-side transistor 11 in accordance with the output signals IN1 and IN2 of the pre-driver 8, and a voltage waveform OUT of the high-withstand voltage output terminal 4 which is output in accordance with the output signal IN3 of the pre-driver 8.

Firstly, an operation when the input signal SAFE of the control signal input terminal 7 is at the H level will be described.

The output signal IN2 of an AND circuit 34 is determined, depending on the output of the AND circuit 31. Therefore, as is similar to the operation of the conventional output circuit, the output of the high-withstand voltage output terminal 4 takes one of the L level, the H level, and the high impedance in accordance with the input signal IN of the input terminal 5 and the input signal HIZ of the input terminal 6.

The high-withstand voltage diode 17 is connected between the high-withstand voltage output terminal 4 and the level shift circuit 9 and has the reverse-bias effect in the direction from the high-withstand voltage output terminal 4 to the level shift circuit 9, so that the thin-film gate N-type MOS transistor 15 and the low-side transistor 12 have the same ON or OFF state. Therefore, no steady-state current flows through the high-withstand voltage diode 17.

Next, an operation when the input signal SAFE of the control signal input terminal 7 is at the L level will be described.

Since the input signal SAFE is at the L level, the output signal IN2 of the AND circuit 34 goes to the L level. Therefore, as is similar to the operation of the conventional output circuit, when the input signal IN is at the L level, the high-withstand voltage output terminal 4 goes to the L level, and when the input signal HIZ is at the L level, the output terminal 4 is forced to go to the high-impedance state.

However, when the input signal IN is at the H level, both the output signals IN1 and IN2 go to the L level, so that both the thin-film gate N-type MOS transistors 15 and 16 included in the level shift circuit 9 are switched OFF. In this case, the thick-film gate P-type MOS transistors 13 and 14 are held in output states as they are immediately before the input signal SAFE is input, due to their parasitic capacitances, and the high-side transistor 11 is held in such an output state for the same reason.

For example, if the high-withstand voltage output terminal 4 is at the H level immediately before the input signal SAFE is input, the high-withstand voltage output terminal 4 is still held at the H level after the signal SAFE is input. Note that the charges of a parasitic capacitance are discharged over time, so that the H level cannot be held, and therefore, it is necessary to cause the input signal SAFE to go to the H level using a control signal.

Hereinafter, an operation when a short-circuit occurs due to any external factor when the high-withstand voltage output terminal 4 outputs the H level by means of the parasitic capacitance in the above-described state, will be described.

When the high-withstand voltage output terminal 4 is short-circuited, the gate of the thick-film gate P-type MOS transistor 14 goes to the L level via the high-withstand voltage diode 17, so that the thick-film gate P-type MOS transistor 14 is switched ON. The input signal IN4 then goes to the H level, so that the thick-film gate P-type MOS transistor 13 and the high-side transistor 11 are switched OFF. As a result, an overcurrent flowing through the high-side transistor 11 is prevented, thereby making it possible to prevent the device from being broken.

Second Embodiment

Figure 3:
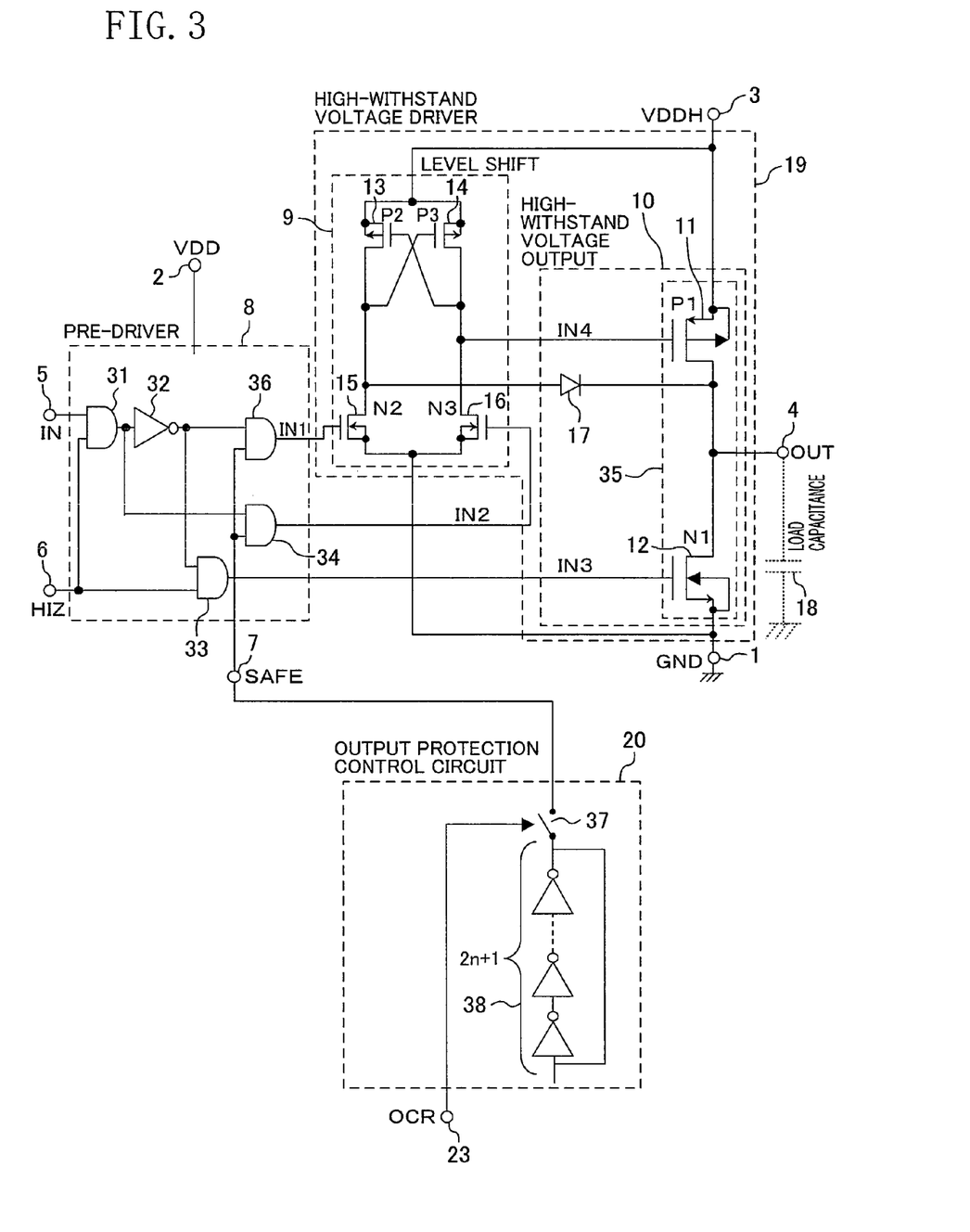
FIG. 3 is a diagram showing an exemplary configuration of a high-withstand voltage driver in a multi-channel semiconductor integrated circuit according to a second embodiment of the present invention.

FIG. 3 is a diagram showing a configuration of a multi-channel semiconductor integrated circuit according to a second embodiment of the present invention.

As shown in FIG. 3, by incorporating an oscillator 38 as an output protection circuit 20 into the multi-channel semiconductor integrated circuit, an input signal SAFE can be asynchronously input. When the parasitic capacitance is discharged over time, so that the H level cannot be held, or a short-circuit occurs, the state of the high-withstand voltage driver 19 can be reset. Note that an input signal OCR which is input through a terminal 23 is a control signal for the oscillator. The configuration of the built-in oscillator of FIG. 3 is only for illustrative purposes, and the present invention is not limited to this.

Third Embodiment

Figure 4:
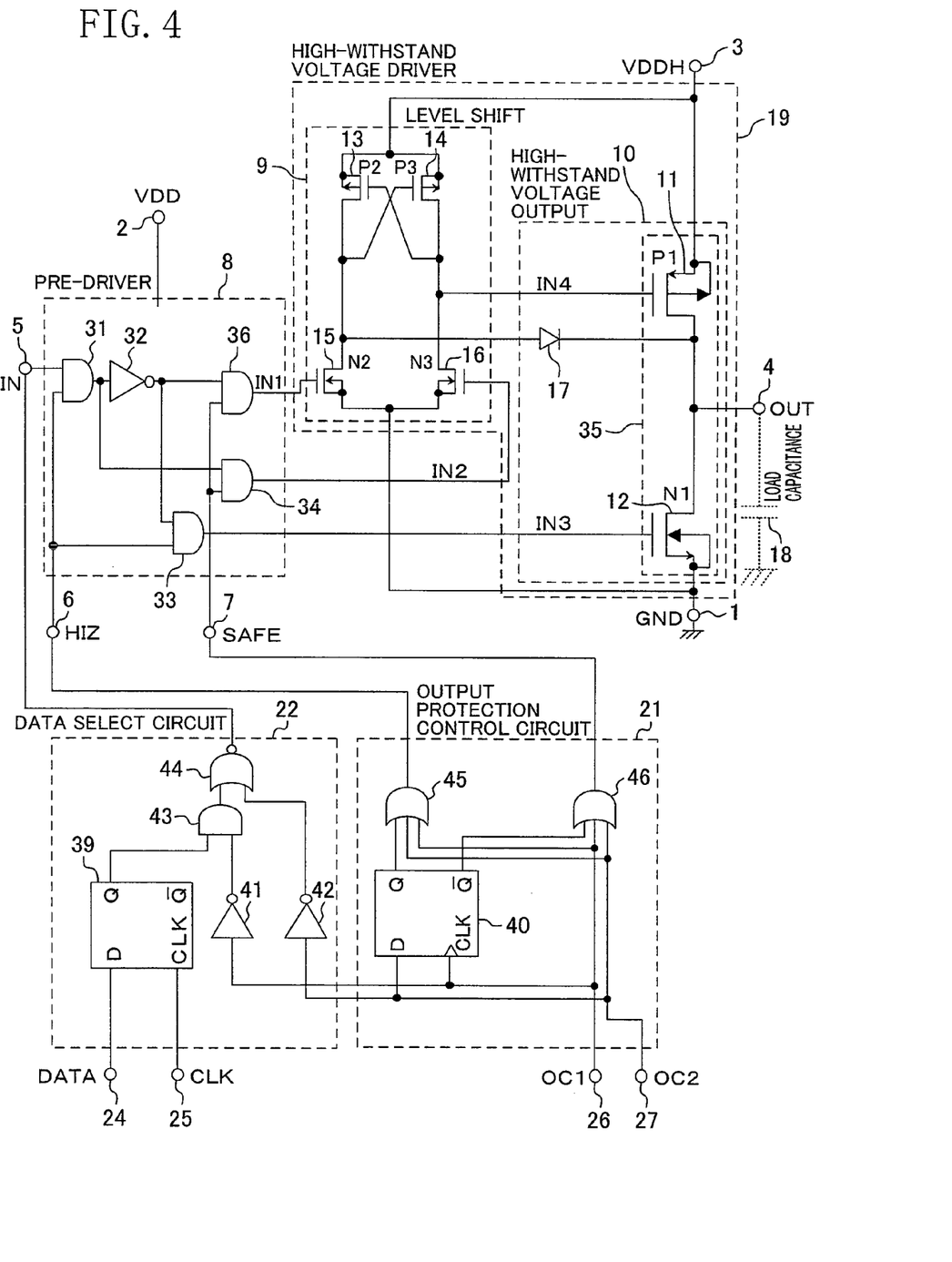
FIG. 4 is a diagram showing an exemplary configuration of a high-withstand voltage driver in a multi-channel semiconductor integrated circuit according to a third embodiment of the present invention.

FIG. 4 is a diagram showing a configuration of a multi-channel semiconductor integrated circuit according to a third embodiment of the present invention.

As shown in FIG. 4, a high-withstand voltage driver 19 comprises a high-withstand voltage output 10 and a level shift circuit 9. The high-withstand voltage output 10 has a half-bridge 35 including a high-side transistor 11 and a low-side transistor 12. The level shift circuit 9 includes thick-film gate P-type MOS transistors 13 and 14 and thin-film gate N-type MOS transistors 15 and 16. The high-withstand voltage driver 19 is driven by a pre-driver 8 in accordance with a signal which is input through a control input terminal 5 from a low-withstand voltage control section, to charge and discharge a load capacity 18. The high-side transistor 11 and the low-side transistor 12 are forced to be switched OFF, via the pre-driver 8 and the level shift circuit 9, in accordance with a signal which is input through a control input terminal 6 irrespective of the state of the control input terminal 5, so that the output terminal goes to the high impedance state. The control input terminals 5, 6, and 7 are controlled, via an output protection control circuit 21 and a data select circuit 22, in accordance with an external binary signal DATA which is input through a terminal 24, a signal CLK which is input through a terminal 25, a signal OC1 which is input through a terminal 26, and a signal OC2 which is input through a terminal 27.

A high-voltage power supply terminal 3 is connected to the high-side transistor 11. A reference potential terminal 1 is connected to the low-side transistor 12. A low-voltage power supply terminal 2 is connected to the pre-driver 8. A high-withstand voltage output terminal 4 is connected to the half-bridge 35. Note that the high-side transistor 11 is used to output a high level, and the low-side transistor 12 is used to output a low level.

The anode of a high-withstand voltage diode 17 is connected to the drain of the thin-film gate N-type MOS transistor 15 of the level shift circuit 9, and the cathode of the high-withstand voltage diode 17 is connected to the high-withstand voltage output terminal 4.

Hereinafter, an operation of the multi-channel semiconductor integrated circuit of the third embodiment of the present invention will be described with reference to FIG. 5.

Figure 5:
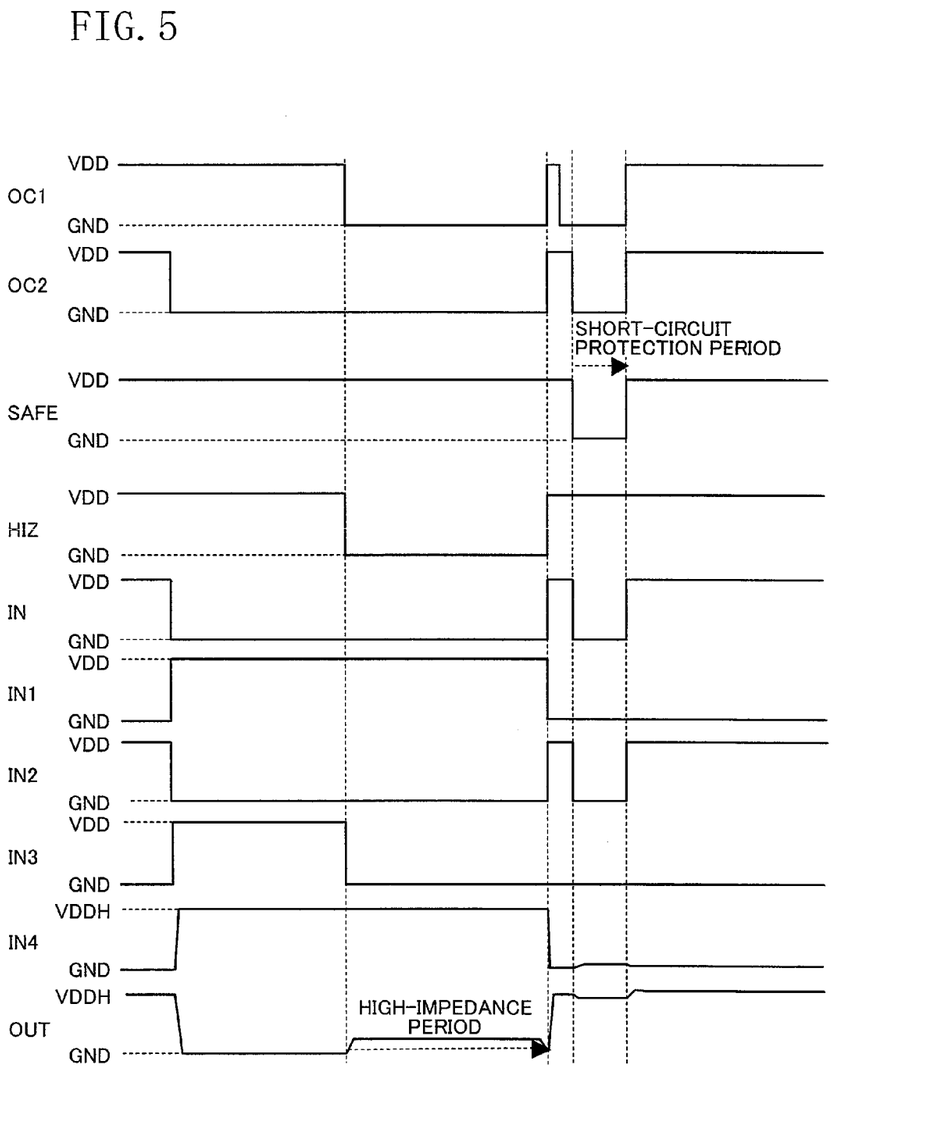
FIG. 5 is a timing diagram for describing an operation of the high-withstand voltage driver in the multi-channel semiconductor integrated circuit of the third embodiment of the present invention.

FIG. 5 is a timing diagram for describing the operation of the multi-channel semiconductor integrated circuit of the third embodiment of the present invention.

FIG. 5 shows the signals OC1 and OC2 which are input signals for controlling an output state of a high-withstand voltage, an input signal IN which is input from the data select circuit 22 to the input terminal 5, an input signal HIZ which is input from the output protection control circuit 21 to the input terminal 6, an input signal SAFE which is input from the output protection control circuit 21 to the input terminal 7, output signals IN1 and IN2 of the pre-driver 8 which are used to drive the level shift circuit 9 in accordance with the input signals IN, HIZ, and SAFE, an output signal IN3 of the pre-driver 8 which is used to drive the low-side transistor 12 in accordance with the input signals IN and HIZ, an output signal IN4 of the level shift circuit 9 which is used to drive the high-side transistor 11 in accordance with the output signals IN1 and IN2 of the pre-driver 8, and an voltage waveform OUT of the high-withstand voltage output terminal 4 which is output in accordance with the output signal IN3 of the pre-driver 8.

Firstly, a case where neither of the output control signals OC1 and OC2 is at the L level will be described.

The input signal HIZ and the input signal SAFE which are the outputs of the output protection control circuit 21 go to the H level, so that the high-withstand voltage output terminal 4 goes to the H or L level in accordance with the input signal IN which is the output of the data select circuit 22.

Next, a case where both the output control signals OC1 and OC2 are at the L level will be described.

A D flip-flop 40 which is a sequential circuit in the output protection control circuit 21 can be used to latch an output state as it is immediately before both the control signals OC1 and OC2 go to the L level. For example, the circuit of FIG. 5 is configured so that, when (OC1, OC2)=(H, H), the high-withstand voltage output terminal 4 is forced to go to the H level, and when (OC1, OC2)=(H, L), the high-withstand voltage output terminal 4 is forced to go to the L level. Therefore, by latching the output control signal OC2 using the output control signal OC1, an output state as it is immediately before (OC1, OC2)=(L, L) can be detected.

By the detection of the output protection control circuit 21, when the high-withstand voltage output terminal 4 is at the L level immediately before, the high-withstand voltage output terminal 4 can be caused to go to the high impedance if (OC1, OC2)=(L, L). When the high-withstand voltage output terminal 4 is at the H level immediately before, the high-withstand voltage output terminal 4 can be switched OFF together with the thin-film gate N-type MOS transistors 15 and 16 in the level shift circuit 9 (short-circuit protecting mode).

The high-withstand voltage output terminal 4 takes the H-level state or the short-circuit protecting mode, depending only on whether the thin-film gate N-type MOS transistor 15 is ON or OFF. Therefore, even if the modes are switched, a through current does not flow during switching in the high-withstand voltage driver 19, so that low power consumption and low noise can be achieved.

The short-circuit protecting mode is thus provided in addition to the DATA mode in which a signal latched using the signals DATA and CLK is output, the H-level output mode, the L-level output mode, and the high-impedance mode (a total of 5 output modes). These modes can be controlled using only the binary output control signals OC1 and OC2, and therefore, no additional external control terminal is required.

Note that, in the above-described embodiments, the "thin-film gate N-type MOS transistor" is employed. The present invention is not limited to this. For example, an IGBT may be employed.

The present invention is useful for a multi-channel semiconductor integrated circuit for driving a capacitive load, such as a PDP or the like.

What is claimed is:

1. A semiconductor integrated circuit comprising:
   a high-side transistor connected to a first reference potential;
   a low-side transistor connected to a second reference potential;
   a level shift circuit connected between the first reference potential and the second reference potential for driving the high-side transistor; and
   a pre-driver circuit connected to a third reference potential for driving the low-side transistor,
   wherein a connection point of the high-side transistor and the low-side transistor serves as an output terminal,
   the level shift circuit has first and second N-type MOS transistors whose gates are driven by the pre-driver circuit, and any one of drains of which is connected to a gate of the high-side transistor, and
   the semiconductor integrated circuit further comprises a diode whose anode is connected to the drain of the first or second N-type MOS transistor to which the gate of the high-side transistor is not connected, and whose cathode is directly connected to the output terminal.

2. The semiconductor integrated circuit of claim 1, wherein
   both the first and second N-type MOS transistors are switched OFF in accordance with a control signal from the pre-driver circuit, and
   the output terminal temporarily holds a state as it is immediately before the control signal is input.

3. The semiconductor integrated circuit of claim 2, further comprising:
   an output protection control circuit for generating the control signal using a plurality of binary input control signals and a sequential circuit.

4. The semiconductor integrated circuit of claim 3, wherein
   the output protection control circuit generates the control signal which switches OFF gate signals of both the first and second transistors after the binary control signals are input if the high-side transistor is ON and the low-side transistor is OFF before the binary control signals are input, and
   the output protection control circuit generates the control signal which switches OFF both the first and second transistors after the binary control signals are input if the high-side transistor is OFF and the low-side transistor is ON before the binary control signals are input.

5. The semiconductor integrated circuit of claim 3, wherein an output circuit including the high-side transistor and the low-side transistor has a plurality of bits.

6. The semiconductor integrated circuit of claim 3, wherein the output protection control circuit is a single common circuit.

7. The semiconductor integrated circuit of claim 2, further comprising:
   an output protection control circuit for generating the control signal using a built-in asynchronous oscillator.

8. The semiconductor integrated circuit of claim 1, wherein the high-side transistor is a thick-film P-type MOS transistor.

9. The semiconductor integrated circuit of claim 1, further comprising an output circuit comprising the high-side transistor and the low-side transistor, said output circuit is a display drive circuit for a flat panel display.

10. A semiconductor integrated circuit comprising:
    a high-side transistor connected to a first reference potential;
    a low-side transistor connected to a second reference potential;

a level shift circuit connected between the first reference potential and the second reference potential for driving the high-side transistor; and a pre-driver circuit connected to a third reference potential for driving the low-side transistor, wherein a connection point of the high-side transistor and the low-side transistor serves as an output terminal, the level shift circuit has first and second IGBTs whose gates are driven by the pre-driver circuit, and any one of drains of which is connected to a gate of the high-side transistor, and the semiconductor integrated circuit further comprises a diode whose anode is connected to the collector of the first or second IGBT to which the gate of the high-side transistor is not connected, and whose cathode is directly connected to the output terminal.

11. The semiconductor integrated circuit of claim 8, wherein both the first and second IGBTs are switched OFF in accordance with a control signal from the pre-driver circuit, and the output terminal temporarily holds a state as it is immediately before the control signal is input.

12. The semiconductor integrated circuit of claim 9, further comprising:

an output protection control circuit for generating the control signal using a plurality of binary input control signals and a sequential circuit.

13. The semiconductor integrated circuit of claim 12, wherein the output protection control circuit generates the control signal which switches OFF gate signals of both the first and second transistors after the binary control signals are input if the high-side transistor is ON and the low-side transistor is OFF before the binary control signals are input, and the output protection control circuit generates the control signal which switches OFF both the first and second transistors after the binary control signals are input if the high-side transistor is OFF and the low-side transistor is ON before the binary control signals are input.

14. The semiconductor integrated circuit of claim 12, wherein an output circuit including the high-side transistor and the low-side transistor has a plurality of bits.

15. The semiconductor integrated circuit of claim 14, wherein the output protection control circuit is a single common circuit.

16. The semiconductor integrated circuit of claim 11, further comprising:

an output protection control circuit for generating the control signal using a built-in asynchronous oscillator.

17. The semiconductor integrated circuit of claim 10, wherein the high-side transistor is a thick-film P-type MOS transistor.

18. The semiconductor integrated circuit of claim 10, further comprising an output circuit comprising the high-side transistor and the low-side transistor, said output circuit is a display drive circuit for a flat panel display.

* * * * *